US005650667A

United States Patent [19]
Liou

[11] Patent Number: 5,650,667
[45] Date of Patent: Jul. 22, 1997

[54] PROCESS OF FORMING CONDUCTIVE BUMPS ON THE ELECTRODES OF SEMICONDUCTOR CHIPS USING LAPPING AND THE BUMPS THEREBY CREATED

[75] Inventor: Shiann-Ming Liou, Campbell, Calif.

[73] Assignee: National Semiconductor Corporation, Santa Clara, Calif.

[21] Appl. No.: 550,244

[22] Filed: Oct. 30, 1995

[51] Int. Cl.[6] ............................................. H01L 21/44
[52] U.S. Cl. ..................... 257/780; 437/183; 228/180.22
[58] Field of Search ................................. 257/752, 780; 437/183; 228/180.22

[56] References Cited

U.S. PATENT DOCUMENTS

| | | | |
|---|---|---|---|
| 4,442,967 | 4/1984 | van de Pas et al. ................ | 228/159 |
| 4,955,523 | 9/1990 | Calomagno et al. ............... | 228/180.22 |
| 5,014,111 | 5/1991 | Tsuda et al. ........................ | 357/68 |
| 5,058,798 | 10/1991 | Yamazaki et al. .................. | 228/110 |
| 5,060,843 | 10/1991 | Yasuzato et al. ................... | 228/179 |
| 5,550,405 | 8/1996 | Cheung ............................... | 257/752 |

OTHER PUBLICATIONS

T. Ohashiwa, et al., "Reflowable Sn-Pb Bump Formation on Al Pad by a Solder Bumping Method," IEEE, 1995, pp. 1203–1208.

*Primary Examiner*—Kenneth J. Ramsey
*Attorney, Agent, or Firm*—Limbach & Limbach L.L.P.

[57] ABSTRACT

A method and structure for electrical contact bumps on a semiconductor die. Contact bumps are formed on the electrode contacts of an integrated circuit, then the surface of the semiconductor is coated with a protective polymer layer, and the layer is wafer lapped to produce contact bumps of uniform height.

21 Claims, 1 Drawing Sheet

PROCESS OF FORMING CONDUCTIVE BUMPS ON THE ELECTRODES OF SEMICONDUCTOR CHIPS USING LAPPING AND THE BUMPS THEREBY CREATED

FIELD OF THE INVENTION

The present invention relates to semiconductor integrated circuits and, in particular, to a method of forming electrical contact bumps for electrically connecting a semiconductor integrated circuit chip to the terminal electrodes of an electrical interface substrate and to the structure of the bumps produced using the method.

DESCRIPTION OF THE RELATED ART

Integrated Circuits (ICs) are formed on silicon wafers which are then diced into individual circuit die. The individual die must then be electrically connected to an interface structure that provides the electrical interface to the chip circuit.

Many techniques have been developed for connecting and packaging ICs. One approach, wire bonding, attaches gold, copper or aluminum wires between the electrodes on the die and electrodes on a chip carrier. In another approach, tape automated bonding (TAB), a network of metallized interfacing connections is etched onto a thin film tape to which the die is attached using a thermal compression technique or with conductive epoxy.

With increasing miniaturization, it has become desirable to directly connect the IC die to the interface structure. The interface structure may be a chip carrier, glass (in the case of liquid crystal display circuits) or, most recently, printed circuit boards (PCBs), as in Chip Size Packaging (CSP).

In order to directly connect the die, a practice has been developed for producing a conductive bump on each of the electrodes on the die to provide an elevated electrical contact surface. The bumps on the die are then attached to corresponding electrodes on the interface structure by means such as solder reflow, thermal compression or conductive epoxy.

There are numerous methods for creating the contact bumps on the IC electrodes. Plating techniques may be employed to deposit a raised contact region onto the semiconductor die. However, the repeated steps of etching and plating are both costly and subject to inaccuracy, which limits the bump height achievable by this method. The successive steps also degrade the quality of the semiconductor circuit and thereby lower the yield of usable devices obtained from the manufacturing process. U.S. Pat. No. 5,058,798 discloses an example of the plating method.

Another common approach is to use wire bonding to attach a metallic ball to the IC electrode. A typical example of this type of method forms the metal ball on the end of a bonding wire fed through a capillary. The capillary presses the ball onto the electrode and is then moved laterally away from the surface of the IC to shear the wire. Examples of wire bonding methods are disclosed in U.S. Pat. Nos. 5,014,111, 5,060,843 and 4,442,967.

The shearing action is inexact in the wire bonding method and the bumps tend to have residual wire attached to them of varying and not precisely controllable length. The residual wire can be long enough to cause a short to adjacent electrodes, particularly if the capillary is moved laterally relative to the surface of the die.

Yasuzato et al (U.S. Pat. No. 5,060,843) sought to reduce the probability of shorting caused by the residual wire by controlling the lateral direction of the capillary shearing motion. They shear the wire in a direction away from any adjacent electrodes so that whatever residual wire remains is bent away from the other electrodes on the die. This requires precise control of the capillary tip motion relative to the semiconductor die. Also, the technique requires that at least one portion adjacent to the electrode be free of other electrodes.

It is also difficult to control the height of the wire bonded bumps. Bumps that are not uniform in height due to size differences or varying residual bonding wire length lack the precision necessary to reliably attach the bare IC chips to the electrodes on the interface substrate.

Yasuzato et al. attempt to control bump height by a method whereby the capillary containing the bonding wire presses the metallic ball against the electrode. The pressure forces a portion of the metallic ball into the capillary tip along with the bonding wire. The capillary tip is then raised a predetermined distance from the ball and then moved laterally to shear off the bonding wire. This approach provides greater control of bump height but still requires very precise control of the capillary tip during processing. Also, the process is performed on each bump individually rather than processing multiple bumps simultaneously.

Yamazaki et al (U.S. Pat. No. 5,058,798) control bump height by using a wedge to press bonding wire onto the IC electrodes rather than forming a ball. A low level of pressure is utilized so that the wire is not flattened or spread against the electrode. This results in a bump of uniform height and narrow pitch. To perform the process, however, requires the specialized wire-bonding equipment that is a subject of the patent and the bumps are processed individually.

Ogashiwa et al ("Reflowable Sn—Pb Bump Formation on Al Pad by a Solder Bumping Method", IEEE #?, 1995, p. 1203) describe a solder reflow method for forming solder bumps on the aluminum electrode pads of semiconductor circuits. The method uses an arc discharge to heat the end of a solder (Sn—Pb) alloy wire to form a ball. The ball is then thermosonically bonded to the aluminum electrode pad using a wire bonding machine. The bonded ball is then heated with a resin flux to cause it the solder to reflow and form a sphere. The resulting solder bump has a consistent spherical shape. However, the size of the sphere varies due to the volume of the alloy material contained in the wire ball initially attached to the electrode.

SUMMARY OF THE INVENTION

The inventive method produces the inventive structure by forming contact bumps on a semiconductor die, then coating the surface of the die containing the electrodes with a polymer, and then lapping the polymer coating to cut the contact bumps to a uniform height.

The uniform height of the bumps improves the quality of the connection between the die and the interfacing substrate. Because the height is controlled without bending the residual wire on the bumps, there is less risk of causing a short between contacts. The polymer coating protects against corrosion of the semiconductor surface and reduces the risk of shorting adjacent electrodes. Lapping the die is also an inexpensive and simple processing step that is well understood and can be performed by existing processing equipment. By using wafer lapping, all the devices on a semiconductor wafer can be lapped in a single step saving the cost of individually processing each die. Because the die have a flat electrode surface, they are easier to handle when they are later mounted.

BRIEF DESCRIPTION OF THE DRAWINGS

The features and advantages of a process for producing conductive bumps using a lapping process and the bumps thus created according to the present invention will be more clearly understood from the following description taken in conjunction with the accompanying drawings in which.

DETAILED DESCRIPTION OF THE PREFERRED EMBODIMENT

Figure 1:
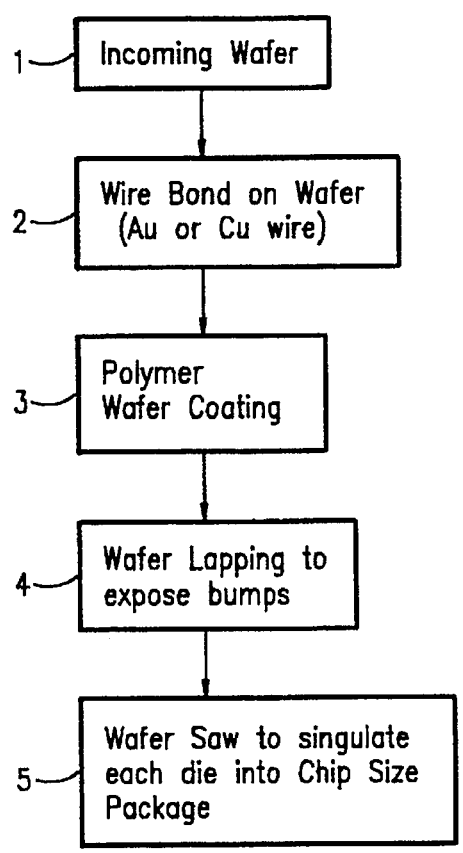
FIG. 1 is a flow diagram describing the steps of the inventive process.
Figure 2A:
FIGS. 2a to 2e are cross sectional views showing the inventive process sequence for forming conductive bumps on an electrode formed on a semiconductor circuit.

FIG. 1 shows the steps comprising a preferred embodiment of a process in accordance with the invention. In step 1, a semiconductor wafer 10, shown in FIG. 2a, is provided that contains a plurality of semiconductor micro-circuits (IC). The electrical contacts to each individual IC have been formed on surface 12 of wafer 10.

Figure 2B:
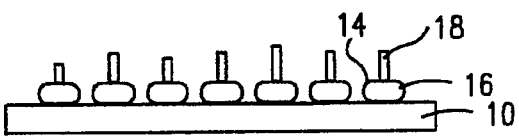

Wire bonding step 2 of the process comprises wire bonding gold (Au), copper (Cu), or tin-lead (Sn—Pb) alloy wire to each electrode on surface 12 to form a conductive bump 14, as shown in FIG. 2b. The wire bonding process produces a metallic ball 16 to which a residual section 18 of bonding wire is connected.

Figure 2C:
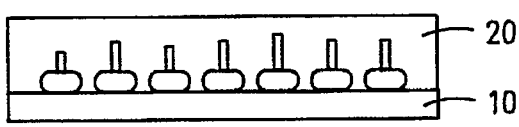

In wafer coating step 3 of the preferred process, a protective polymer coating 20 such as polyamide is formed on surface 12. The thickness of the coating 20 is such that the coating forms a continuous layer that covers each conductive bump 14, as shown in FIG. 2c.

Figure 2D:
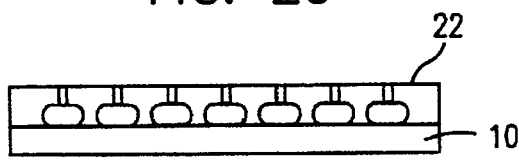
Figure 2E:
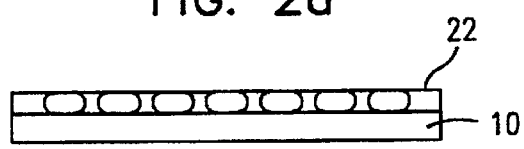

The polymer coating 20 on wafer 10 is then lapped in the wafer lapping step 4 of the process to create a planar surface 22 on the coating 20 that includes an exposed portion of each conductive bump 14. The lapping of coating 20 removes enough coating material to expose a conductive surface on each conductive bump 14 formed on the wafer 10. The wafer lapping step 4 is controlled so that the exposed portion of each conductive bump 14 is in the residual bonding wire 18 of each conductive bump 14, as shown in FIG. 2d, or in the metallic ball 16 portion of the conductive bump 14, as shown in FIG. 2e.

Figure 3:
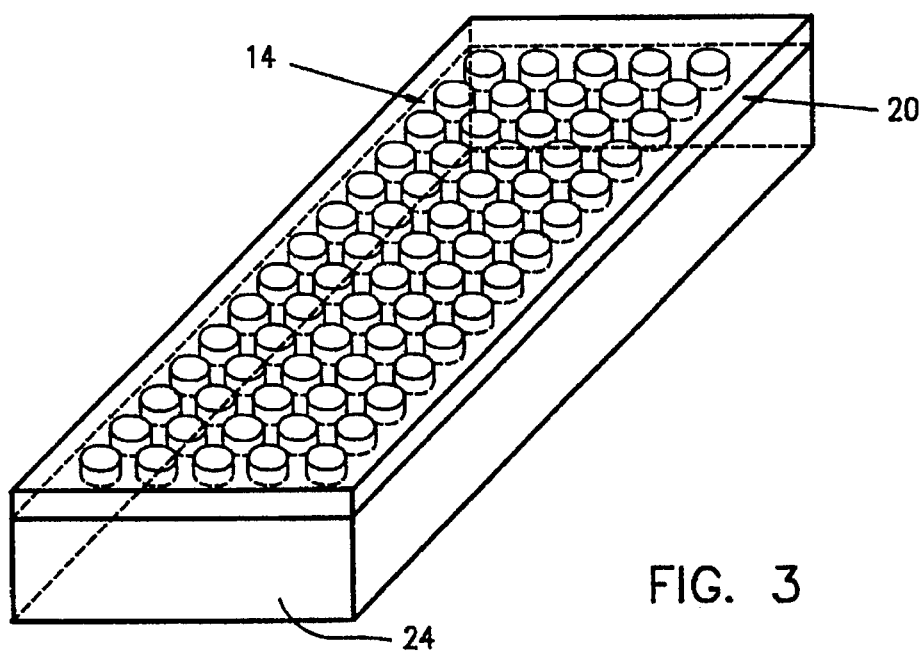
FIG. 3 is a perspective view of a semiconductor die produced according to the invention.

In the final wafer sawing step 5 of the process, the wafer 10 is diced to produce the individual die 24 that contains an individual IC, as shown in FIG. 3. Each die 24 contains conductive bumps 14 surrounded by the protective polymer coating 20.

At the end of the process, the die 24 constitutes a Chip Size Package (CSP) that is suitable for bonding to a printed circuit board or other interface structure using conductive epoxy.

What is claimed is:

1. A method for forming a bump on an electrode formed on a surface of a semiconductor element, the method comprising the steps of:

attaching a conductive structure to the electrode;

coating the surface of the semiconductor containing the electrode to cover the conductive structure; and lapping the coating to expose a portion of the conductive structure.

2. The process of claim 1, wherein the conductive structure comprises a metal.

3. The process of claim 2, wherein the metal comprises Au (Gold).

4. The process of claim 2, wherein the metal comprises Cu (Copper).

5. The process of claim 2, wherein the metal comprises Sn—Pb (Tin-Lead) alloy.

6. The process of claim 1, wherein the coating material comprises a polymer.

7. The process of claim 1, wherein the conductive structure is attached to the electrode by means of wire bonding.

8. The process of claim 1, wherein the lapping is performed in a direction substantially parallel to the surface of the semiconductor.

9. A method for forming a bump on an electrode formed on a surface of a semiconductor wafer element, the method comprising the steps of:

attaching a conductive structure to the electrode;

coating the surface of the semiconductor wafer element containing the electrode;

lapping the coating over the semiconductor wafer element to cut the conductive structure.

10. The process of claim 9, wherein the conductive structure comprises a metal.

11. The process of claim 10, wherein the metal comprises Au (Gold).

12. The process of claim 10, wherein the metal comprises Cu (Copper).

13. The process of claim 10, wherein the metal comprises Sn—Pb (Tin-Lead) alloy.

14. The process of claim 9, wherein the coating material comprises a polymer.

15. The process of claim 9, wherein the conductive structure is attached to the electrode by means of wire bonding.

16. The process of claim 9, wherein the lapping is performed in a direction substantially parallel to the surface of the semiconductor.

17. A plurality of electrical contact bumps formed on an electrode pad formed on a semiconductor substrate, each bump comprising:

a raised portion made of an electrically conductive material, the raised portion having a first surface that is attached to the electrode pad; and a protective coating formed on the semiconductor substrate surrounding the raised portion, such that a second surface of the raised portion remains exposed which is substantially parallel to the first surface; and wherein the second surface is substantially co-planar with the second surfaces of all other bumps formed on the semiconductor substrate.

18. The electrical contact bumps of claim 17, wherein the protective coating comprises a polymer.

19. The electrical contact bumps of claim 17, wherein the conductive material comprises Au (Gold).

20. The electrical contact bumps of claim 17, wherein the conductive material comprises Cu (Copper).

21. The electrical contact bumps of claim 17, wherein the conductive material is Sn—Pb (Tin-Lead) alloy.

* * * * *